(12) United States Patent
Yokai

(10) Patent No.: US 8,105,644 B2
(45) Date of Patent: Jan. 31, 2012

(54) MANUFACTURING METHOD OF PRINTED CIRCUIT BOARD

(75) Inventor: Takahiko Yokai, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 878 days.

(21) Appl. No.: 12/043,460

(22) Filed: Mar. 6, 2008

(65) Prior Publication Data
US 2008/0217383 A1    Sep. 11, 2008

Related U.S. Application Data

(60) Provisional application No. 60/893,701, filed on Mar. 8, 2007.

(51) Int. Cl.
*B05D 5/12* (2006.01)
*B05D 5/00* (2006.01)

(52) U.S. Cl. ............... 427/98.4; 427/98.5; 427/282

(58) Field of Classification Search .......... 427/98.4, 427/98.5, 282; 118/504
See application file for complete search history.

(56) References Cited

U.S. PATENT DOCUMENTS

| | | | | |
|---|---|---|---|---|
| 6,012,231 | A * | 1/2000 | Regner et al. | 33/562 |
| 6,479,755 | B1 | 11/2002 | Kim et al. | |
| 6,767,473 | B2 * | 7/2004 | Fujita et al. | 216/27 |
| 7,223,316 | B2 * | 5/2007 | Murase | 156/293 |

FOREIGN PATENT DOCUMENTS

| | | | |
|---|---|---|---|
| JP | 02038161 U | | 3/1990 |
| JP | 02-172292 | * | 7/1990 |
| JP | 02172292 A | | 7/1990 |
| JP | 04314389 A | | 11/1992 |
| JP | 04-373156 | * | 12/1992 |
| JP | 04373156 A | | 12/1992 |
| JP | 07-040675 A | | 2/1995 |
| JP | 11154784 A | | 6/1999 |
| JP | 2001102732 A | | 4/2001 |

OTHER PUBLICATIONS

Office Action issued on Dec. 21, 2010 by Japanese Patent Office in counterpart Japanese Patent Application No. 2007-041786 (with English translation).
Decision of Refusal issued on Aug. 23, 2011 in Japanese Patent Application No. 2007-041786 (with partial English translation).

* cited by examiner

*Primary Examiner* — Brian K Talbot
(74) *Attorney, Agent, or Firm* — Panitch Schwarze Belisario & Nadel LLP

(57) ABSTRACT

A screen plate having a plurality of openings is placed on a suspension substrate in which a plurality of conductive pads are formed. Conductive paste is moved in one direction on an upper surface of the screen plate, so that the conductive paste is applied onto the conductive pads through the openings. A recess that is inwardly bent is formed in each of the openings of the screen plate.

3 Claims, 9 Drawing Sheets

F I G. 3
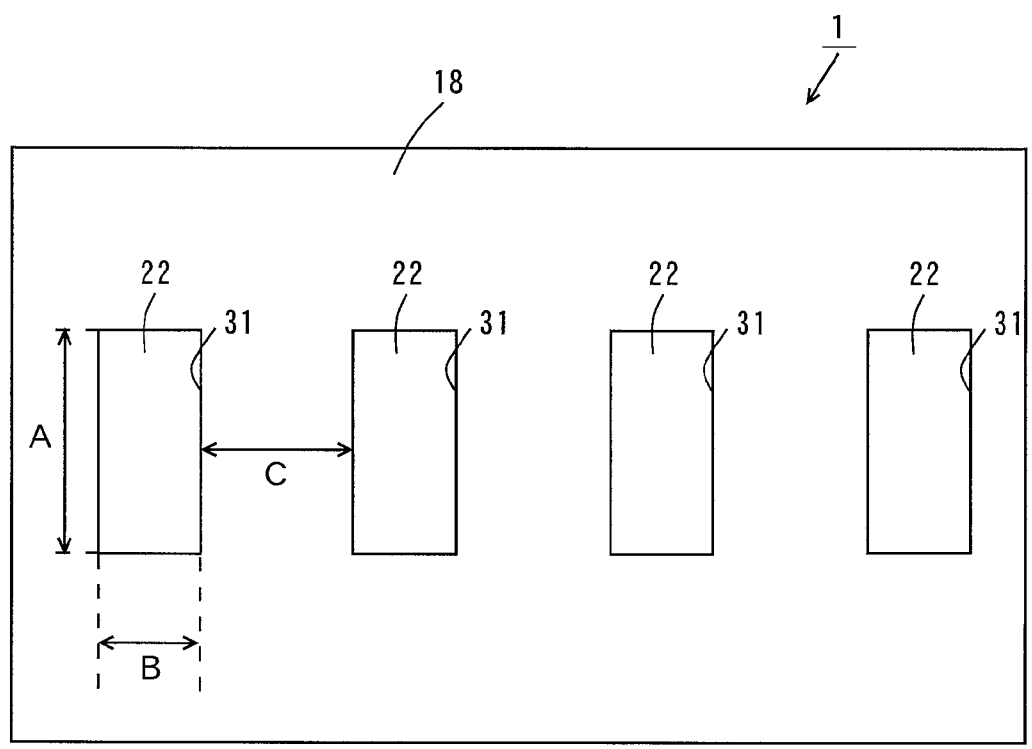

MANUFACTURING METHOD OF PRINTED CIRCUIT BOARD

CROSS-REFERENCE TO RELATED APPLICATION

This application is a non-provisional of U.S. Patent Application No. 60/893,701, filed Mar. 8, 2007, and the disclosure of which is incorporated herein by reference.

BACKGROUND OF THE INVENTION

1. Field of the Invention

The present invention relates to a manufacturing method of a printed circuit board.

2. Description of the Background Art

A printed circuit board is provided with electrode pads for mounting electronic components or the like. When the electronic components or the like are mounted on the printed circuit board, soldering paste is applied onto the electrode pads (see JP 7-40675 A, for example). Terminals of the electronic components are reflow-soldered onto the electrode pads by using this soldering paste, thereby causing the electronic components to be mounted on the printed circuit board.

The soldering paste is applied onto the electrode pads by a screen printing, for example. In the screen printing, the soldering paste is applied onto the printed circuit board through a screen plate while the printed circuit board is fixed on a stage of a screen printing device. Thus, the soldering paste with its shape corresponding to the shape of opening of the screen plate is printed on each of the electrode pads.

In recent years, as electronic equipment and the like become more sophisticated, the electronic components mounted on the printed circuit board have been miniaturized. Thus, spacing between the electrode pads for mounting the electronic components has been narrower.

Therefore, when the soldering paste is printed on the electrode pads by a conventional screen printing method, the soldering paste on one electrode pad may come into contact with the soldering paste on another electrode pad adjacent thereto, causing a short circuit during the printing. Moreover, also when the electronic components are reflow-soldered onto the electrode pads, the soldering paste on one electrode pad may come into contact with the soldering paste on another electrode pad adjacent thereto.

SUMMARY OF THE INVENTION

An object of the present invention is to provide a manufacturing method of a printed circuit board capable of preventing a short circuit.

(1) According to an aspect of the present invention, a manufacturing method of a printed circuit board includes the steps of forming a circuit board having a plurality of conductive pads on an insulating layer of the circuit board, and placing a printing mask, which has a plurality of openings corresponding to the plurality of conductive pads, on the circuit board and applying conductive paste onto the plurality of conductive pads through the plurality of openings, wherein respective peripheries of the openings of the printing mask are bent in a concave shape toward respective insides of the openings to form recesses.

According to this manufacturing method of the printed circuit board, first, the circuit board having the plurality of conductive pads on the insulating layer is formed. The printing mask having the plurality of openings is subsequently placed on the circuit board, and the conductive paste is applied onto the plurality of conductive pads through the openings.

Here, the recess that is inwardly bent in the concave shape is formed in each of the openings of the printing mask. Using this printing mask causes the conductive paste to be applied onto the conductive pads in a shape having the recess that is the same as the shape of the opening.

In this case, the conductive paste can be prevented from spreading to a large extent at the time of connecting terminals of electronic components to the conductive pads. This can prevent a short circuit caused by the conductive paste on one conductive pad coming into contact with the conductive paste on another conductive pad adjacent thereto during reflow, even though spacing between the plurality of conductive pads is narrow.

(2) The recesses of the adjacent openings in the printing mask may be formed in positions in which the recesses are opposite to one another.

In this case, the conductive paste on one conductive pad can be prevented from spreading so as to come close to the conductive paste on another conductive pad adjacent thereto at the time of connecting the terminals of the electronic components to the conductive pads. Accordingly, a short circuit caused by the conductive paste on one conductive pad coming into contact with the conductive paste on another conductive pad adjacent thereto can be reliably prevented.

(3) Each of the plurality of openings may be composed of a first wide portion, a narrow portion and a second wide portion that are formed in a rectangular region, the first and second wide portions may be arranged along both end sides of the rectangular region, the narrow portion may be arranged between the first wide portion and the second wide portion so as to extend in parallel with both lateral sides of the rectangular region, the recesses may correspond to respective regions between the both lateral sides of the rectangular region and both lateral sides of the narrow portion, when it is assumed that a length of the lateral side of the rectangular region is a, a length of the end side of the rectangular region is b, and an area of the opening is A, the opening may satisfy a relation obtained by $$0.05 < (a \times b - A)/(a \times b).$$

In this case, the conductive paste can be more reliably prevented from spreading to a large extent at the time of bonding the terminals of the electronic components to the conductive pads. This can more reliably prevent a short circuit caused by the conductive paste on one conductive pad coming into contact with the conductive paste on another conductive pad adjacent thereto.

(4) The opening may satisfy a relation obtained by $$(a \times b - A)/(a \times b) < 0.12.$$

In this case, shortage in amount of the applied conductive paste on the conductive pads can be prevented. This can prevent generation of mounting defects of the electronic components.

(5) The recesses may have substantially a quadrangular shape.

In this case, the conductive paste can be sufficiently prevented from spreading to a large extent at the time of bonding the terminals of the electronic components to the conductive pads. This can sufficiently prevent a short circuit caused by the conductive paste on one conductive pad coming into contact with the conductive paste on another conductive pad adjacent thereto.

According to the present invention, the conductive paste is applied onto the conductive pads in the shape having the recess. In this case, the conductive paste can be prevented from spreading to a large extent at the time of connecting the terminals of the electronic components to the conductive pads. This can prevent a short circuit caused by the conductive paste on one conductive pad coming into contact with the conductive paste on another conductive pad adjacent thereto during the reflow, even though the spacing between the plurality of conductive pads is narrow.

Other features, elements, characteristics, and advantages of the present invention will become more apparent from the following description of preferred embodiments of the present invention with reference to the attached drawings.

BRIEF DESCRIPTION OF THE DRAWINGS

FIG. 3 is a schematic top view of the suspension substrate;

DESCRIPTION OF THE PREFERRED EMBODIMENTS

Hereinafter, description is made of a manufacturing method of a printed circuit board according to an embodiment of the present invention while referring to drawings. Note that description is made of a manufacturing method of a suspension substrate for a magnetic head of a HDD (Hard Disk Drive) as an example of the printed circuit board in the following description.

(1) The Suspension Substrate

Figure 1:
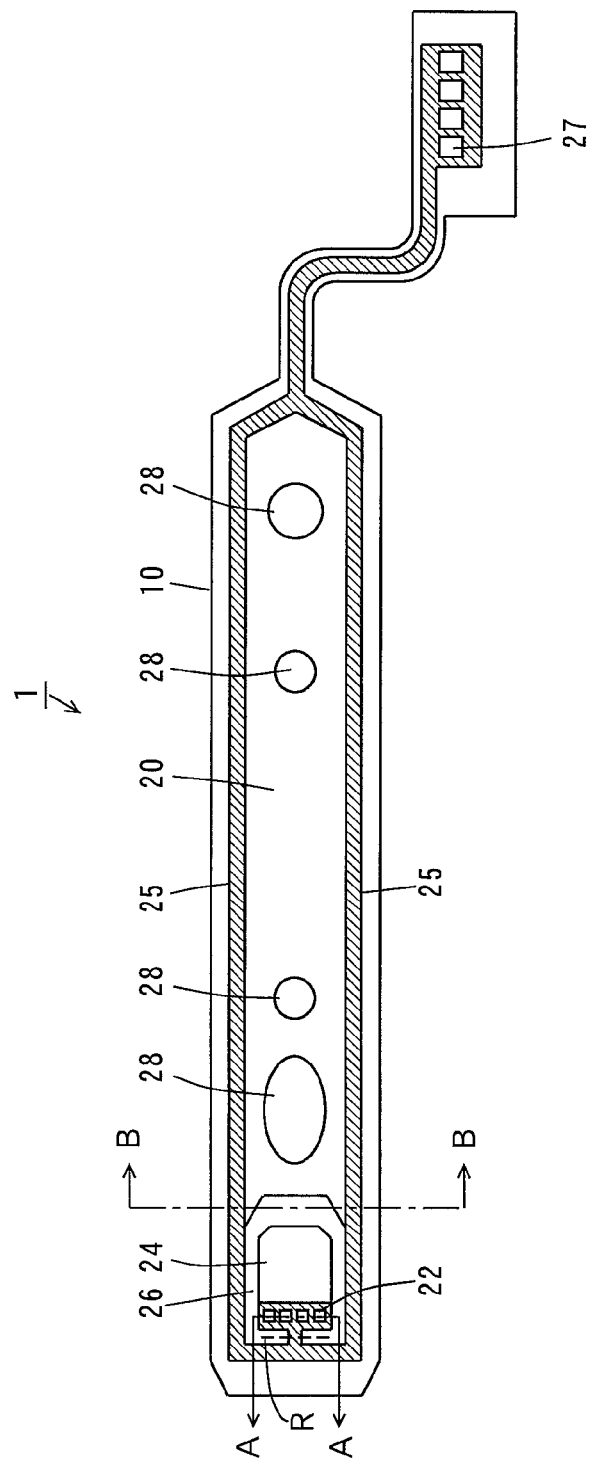
FIG. 1 is a plan view of a suspension substrate according to the present embodiment.
Figure 2:
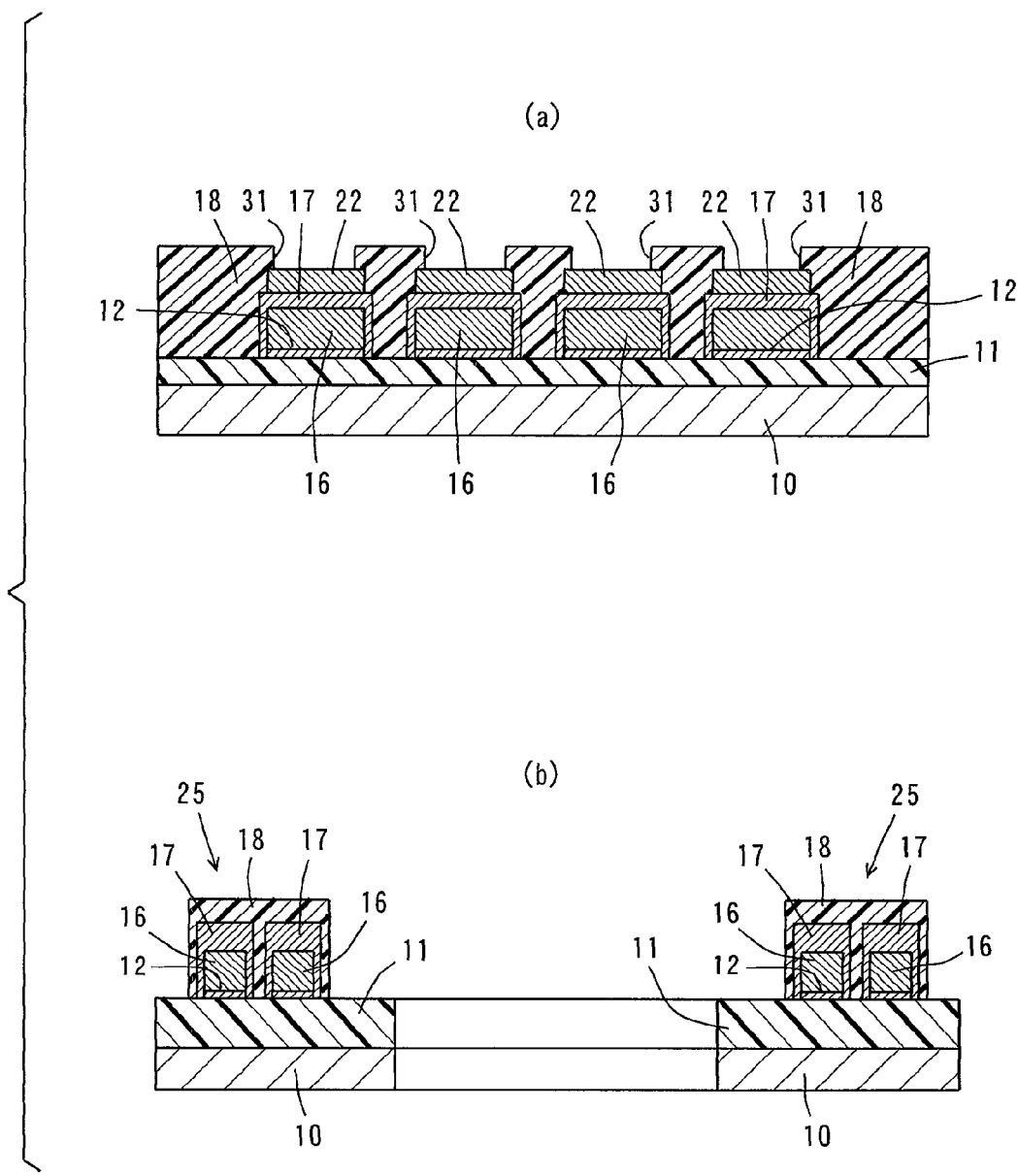
FIG. 2 is a sectional view of the suspension substrate of FIG. 1.

FIG. 1 is a plan view of the suspension substrate according to the present embodiment. FIG. 2 (*a*) is a sectional view taken along the line A-A of the suspension substrate of FIG. 1, and FIG. 2 (*b*) is a sectional view taken along the line B-B of the suspension substrate of FIG. 1.

As shown in FIG. 1, the suspension substrate 1 includes a suspension body 20 formed of a long-sized substrate 10 made of stainless steel. A wiring pattern 25 is formed on the suspension body 20. At one end of the suspension body 20, a U-shaped opening 26 is formed, thereby providing a magnetic head supporting portion (herein after referred to as a tongue) 24. The tongue 24 is bent along the broken line R to form a predetermined angle with respect to the suspension body 20.

Four electrode pads 22 are formed at an end of the tongue 24. Four electrode pads 27 are formed at the other end of the suspension body 20. The electrode pads 22 on the tongue 24 and the electrode pads 27 at the other end of the suspension body 20 are electrically connected to each other by the wiring pattern 25. A plurality of holes 28 are formed in the suspension body 20.

As shown in FIG. 2, an insulating layer 11 made of polyimide is formed on the substrate 10. A chromium film 12, a conductor layer pattern 16 made of copper and a nickel film 17 are sequentially stacked at four positions on the insulating layer 11, and an electrode pad 22 made of gold is formed on each of the nickel films 17. A coating layer 18 made of polyimide is formed on the insulating layer 11 such that predetermined regions on the upper surfaces of the electrode pads 22 are exposed. The electrode pads 27 of FIG. 1 are formed similarly to the electrode pads 22. Note that the coating layer 18 is not shown in FIG. 1.

As shown in FIG. 2 (*b*), the chromium film 12, the conductor layer pattern 16 made of copper and the nickel film 17 are sequentially stacked on the insulating layer 11 at two positions on each side. The two sets of chromium film 12, conductor layer pattern 16 and nickel film 17 on each side are coated with the coating layer 18. Thus, the wiring pattern 25 is formed.

(2) Applying Method of Conductive Paste

FIG. 3 is a schematic top view of a portion of the suspension substrate 1 shown in FIG. 2 (*a*). In the suspension substrate 1 according to the present embodiment, a plurality of rectangular openings 31 are formed in the coating layer 18 such that the upper surfaces of the electrode pads 22 are exposed as shown in FIG. 2 and FIG. 3.

When a magnetic head is connected to the tongue 24 (FIG. 1), the conductive paste is applied onto regions in which the electrode pads 22 are exposed by a screen printing method. Then, output terminals of the magnetic head are connected to the electrode pads 22 by a reflow method, for example. Note that soldering paste, copper paste, silver paste or the like can be used as the conductive paste, for example. Hereinafter, the applying method of the conductive paste is described using drawings.

Figure 4:
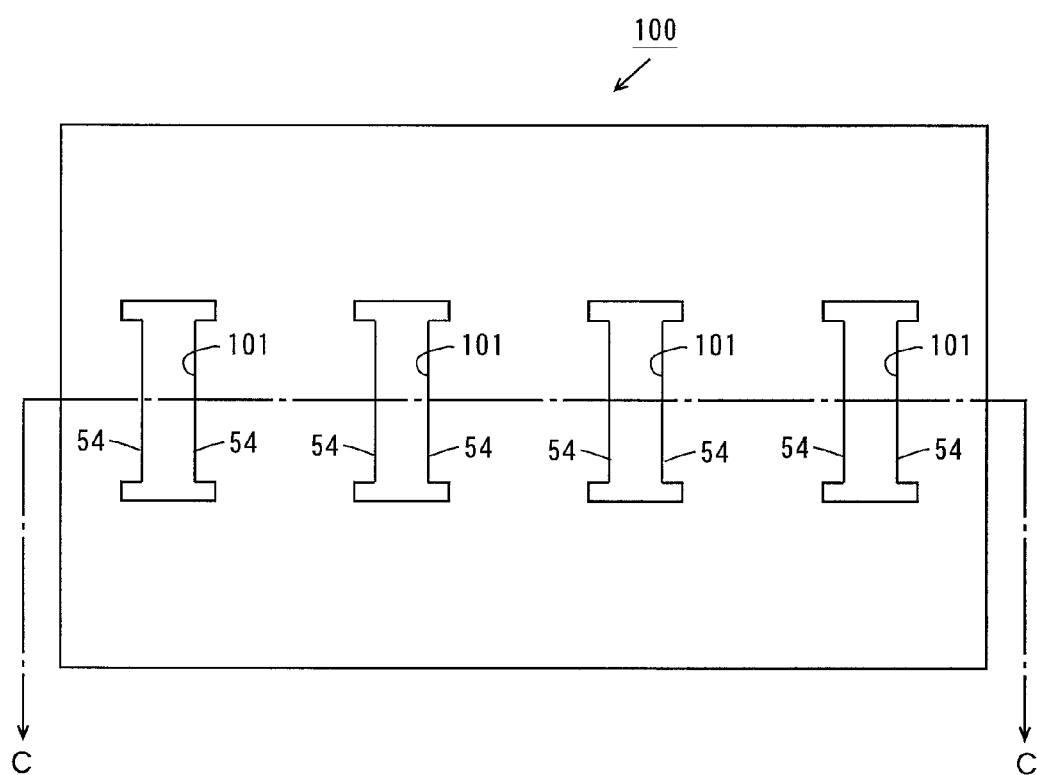
FIG. 4 is a plan view showing a screen plate.

FIG. 4 is a plan view showing a screen plate used in application of the conductive paste. As shown in FIG. 4, four openings 101 are formed in the screen plate 100. The screen plate 100 is made of stainless steel, for example.

Figure 5:
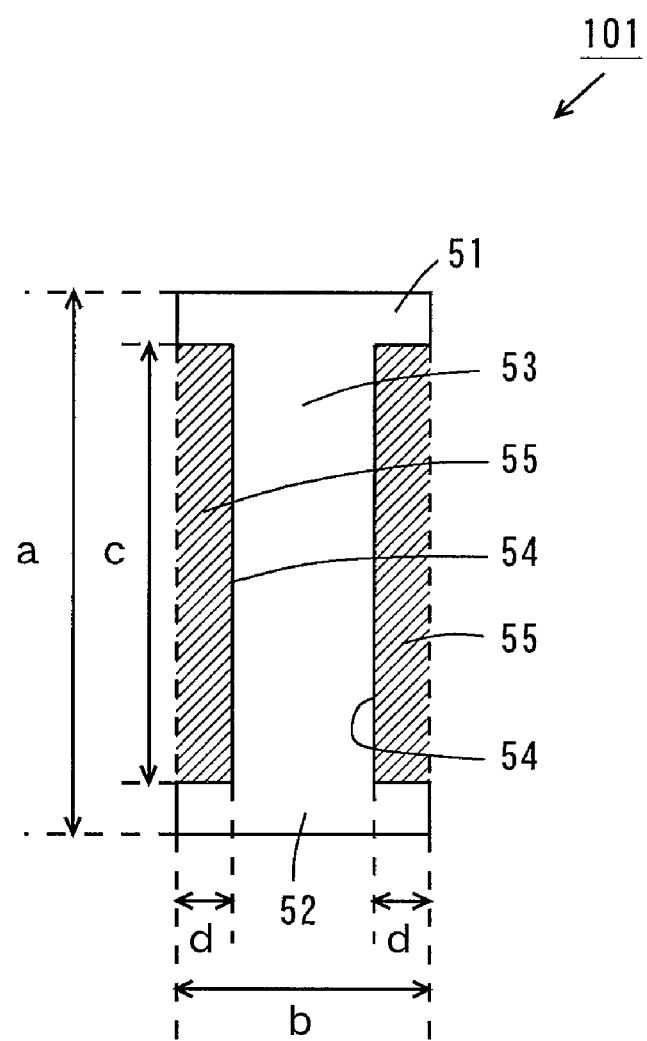
FIG. 5 is a diagram showing an opening of FIG. 4.

FIG. 5 is a diagram showing the opening 101 of FIG. 4. As shown in FIG. 5, the opening 101 has wide portions 51, 52 at both ends in a longitudinal direction and a narrow portion 53 between the wide portion 51 and the wide portion 52. A recess 54 surrounded by the wide portions 51, 52 and the narrow portion 53 is formed on each side of the opening 101.

Figure 6:
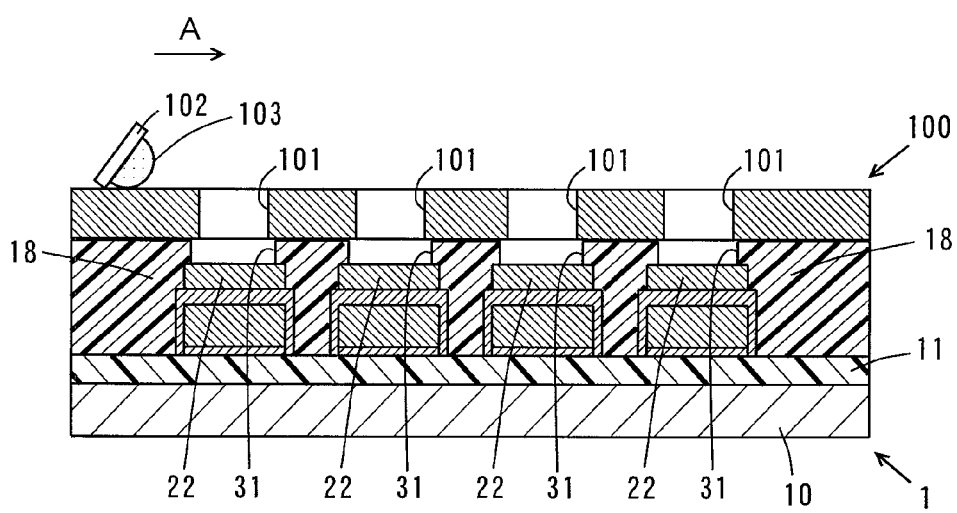
FIG. 6 is a diagram for explaining an applying method of conductive paste.
Figure 7:
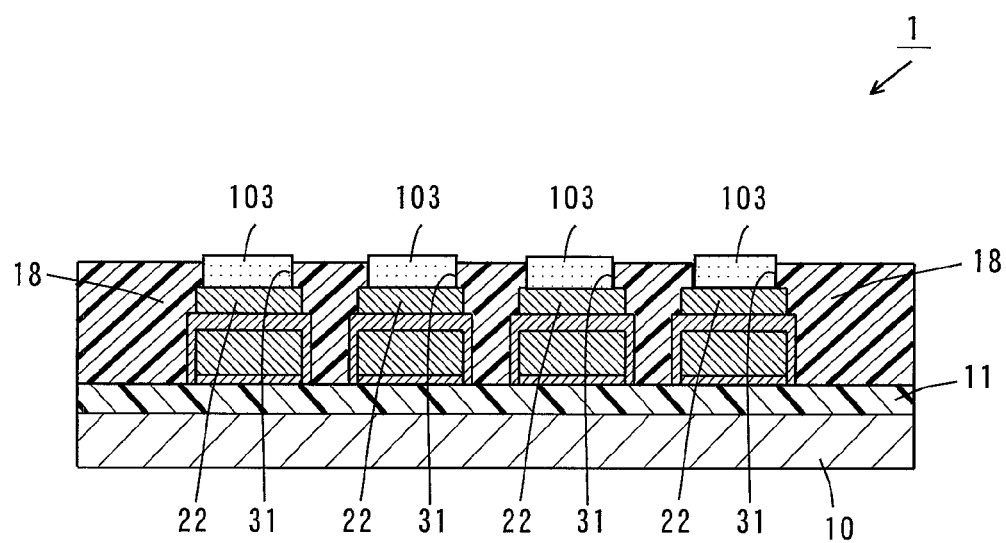
FIG. 7 is a diagram showing the suspension substrate on which the conductive paste has been applied.

FIG. 6 is a diagram for explaining the applying method of the conductive paste onto the electrode pads 22. Note that the sectional view taken along the line A-A of the suspension substrate 1 of FIG. 1 (FIG. 2 (*a*)) and a sectional view taken along the line C-C of the screen plate 100 of FIG. 4 are shown in FIG. 6. FIG. 7 is a diagram showing the suspension substrate 1 on which the conductive paste has been applied.

First, the screen plate 100 is placed on the upper surface of the suspension substrate 1 such that the openings 101 are arranged above the openings 31 as shown in FIG. 6. Next, the conductive paste 103 is moved in one direction (a direction indicated by the arrow A) on an upper surface of the screen plate 100 by using a squeegee 102 of a screen printing device. At this time, the conductive paste 103 flows into the openings 31 through the openings 101. Then, the suspension substrate 1 and the screen plate 100 are separated from each other. Accordingly, the application of the conductive paste 103 onto the electrode pads 22 is completed as shown in FIG. 7.

(3) Effects of the Present Embodiment

In the manufacturing method according to the present embodiment, the conductive paste 103 is applied onto the electrode pads 22 through the openings 101 each having the recesses 54 on its both sides as described using FIG. 5 and FIG. 6.

In this case, the conductive paste 103 is applied onto each of the electrode pads 22 in the same shape as that of the opening 101 (the shape having a recess at the center thereof) Thus, the conductive paste 103 can be prevented from spreading to a large extent in a width direction at the time of connecting the terminals of the electronic components to the electrode pads 22. This can prevent the conductive paste 103 on one electrode pad 22 from coming into contact with the conductive paste 103 on another electrode pad 22 adjacent thereto during reflow, even though spacing between the plurality of electrode pads 22 is narrow. As a result, generation of a short circuit in the suspension substrate 1 can be prevented.

In addition, the plurality of openings 101 are formed such that the recesses 54 of one opening 101 are opposite to the recesses 54 of another opening 101 adjacent thereto as shown in FIG. 4. This can reliably prevent the conductive paste 103 on one electrode pad 22 from coming into contact with the conductive paste 103 on another electrode pad 22 adjacent thereto during the reflow.

(4) The Recesses of the Opening

The size of the recesses 54 of the opening 101 is described using FIG. 5. Note that rectangular regions (regions indicated by hatching) surrounded by the wide portions 51, 52 and the narrow portion 53 on the sides of the opening 101 are referred to as recess formation regions 55 in the following description.

Assuming that the length in the longitudinal direction of the opening 101 is a, the length thereof in the width direction is b, the length in the longitudinal direction of the recess formation region 55 is c, the length thereof in the width direction is d, the recess formation region 55 is preferably set so as to satisfy the following equation (1).

$$0.05 < (c \times d \times 2)/(a \times b) < 0.12 \quad (1)$$

That is, the opening 101 is preferably formed such that a sum of areas of the two recess formation regions 55 is a size of not less than 5% and not more than 12% of an area of a rectangle formed by the length a in the longitudinal direction and the length b in the width direction of the opening 101 in the present embodiment. The two recess formation regions 55 with the sum of the areas thereof being not less than 5% of the area of the rectangle can reliably prevent the conductive paste 103 on one electrode pad 22 from coming into contact with the conductive paste 103 on another electrode pads 22 adjacent thereto, and the two recess formation regions 55 with the sum of the areas thereof being not more than 12% of the area of the rectangle can reliably prevent mounting defects of the electronic components caused by shortage in amount of the conductive paste 103.

Note that the opening 101 is more preferably formed such that the sum of the areas of the two recess formation regions 55 is not less than 6% of the area of the rectangle formed by the length a in the longitudinal direction and the length b in the width direction of the opening 101.

(5) Other Examples of the Opening

While description is made of a case where the opening 101 has the rectangular recesses 54 in the foregoing, the recesses 54 having other shapes may be formed in the opening 101.

Figure 8:
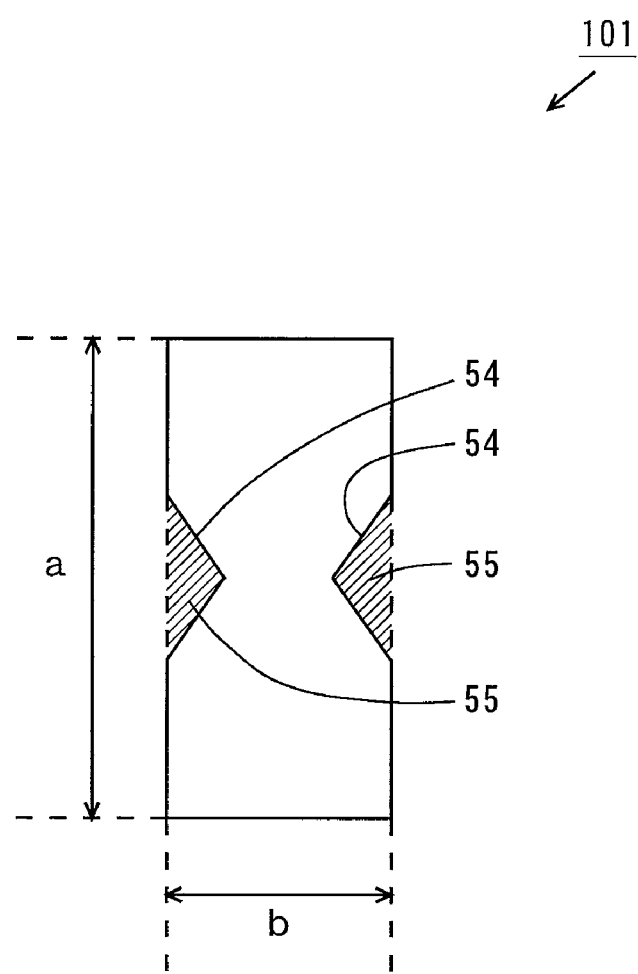
FIG. 8 is a diagram showing another example of the opening.
Figure 9:
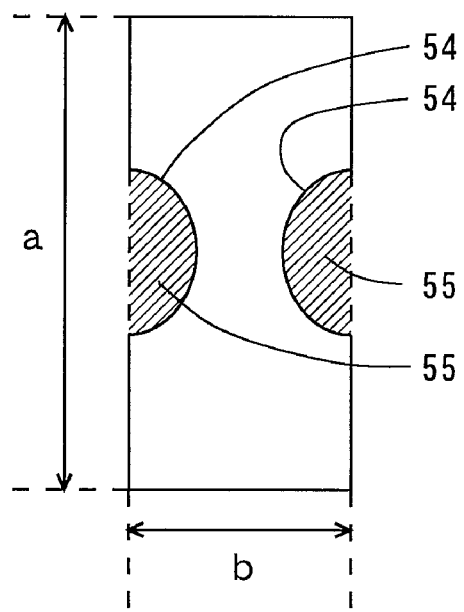
FIG. 9 is a diagram showing another example of the opening.

FIG. 8 and FIG. 9 are diagrams showing other examples of the opening 101.

In the opening 101 of FIG. 8, the triangular recesses 54 are formed. In the example shown in FIG. 8, the two triangular recess formation regions 55 are preferably formed such that a sum of areas thereof is a size of not less than 6% and not more than 12% of the area of the rectangle formed by the length a in the longitudinal direction and the length b in the width direction of the opening 101.

In the opening 101 of FIG. 9, the semicircular recesses 54 are formed. In the example shown in FIG. 9, the two semicircular recess formation regions 55 are preferably formed such that a sum of areas thereof is a size of not less than 6% and not more than 12% of the area of the rectangle formed by the length a in the longitudinal direction and the length b in the width direction of the opening 101.

While the two recesses 54 are formed in each of the openings 101 in the foregoing, three or more recesses 54 or one recess 54 may be formed in each of the openings 101.

Moreover, the recess 54 may have other polygonal shapes such as pentagon or hexagon.

(6) Correspondences Between Elements in the Claims and Parts in Embodiments

In the following paragraph, non-limiting examples of correspondences between various elements recited in the claims below and those described above with respect to various embodiments of the present invention are explained.

In the above described embodiment, the electrode pad 22 is an example of a conductive pad, the screen plate 100 is an example of a printing mask, the rectangle formed by the length a in the longitudinal direction and the length b in the width direction of the opening 101 is an example of a rectangular region, the wide portion 51 is an example of a first wide portion and the wide portion 52 is an example of a second wide portion.

As each of various elements recited in the claims, various other elements having configurations or functions described in the claims can be also used.

INVENTIVE EXAMPLES

Hereinafter, description is made of inventive examples and a comparative example in the present invention. In the inventive examples and the comparative example, the suspension substrate 1 having the electrode pads 22 with the shape shown in FIG. 2 (a) and FIG. 3 was manufactured, and the soldering paste as the conductive paste 103 was applied onto the electrode pads 22 by the method described using FIG. 6. Then, the suspension substrate 1 on which the conductive paste 103 had been applied was kept in an atmosphere at a temperature of 100° C. to 260° C. for 130 seconds, and a state of the conductive paste was observed.

Note that the length A in the longitudinal direction of the exposed region of the electrode pad 22 of FIG. 3 was 700 μm, and a width B thereof was 280 μm in the present inventive examples. A distance C between the electrode pads 22 was 230 μm.

(1) First Inventive Example

In the manufacturing method of a first inventive example, the conductive paste 103 was applied onto the suspension substrate 1 by using the screen plate 100 of 150 μm in thickness made of stainless steel and having the openings 101 with the shape shown in FIG. 4 and FIG. 5.

The lengths a, b, c and d shown in FIG. 5 of the opening 101 were 900 μm, 280 μm, 700 μm and 15 μm, respectively. In this case, the sum of the areas of the two recess formation regions 55 was a size of about 8% of the area of the rectangle formed by the length a in the longitudinal direction and the length b in the width direction of the opening 101.

After the suspension substrate 1 on which the conductive paste 103 had been applied by the manufacturing method of the first inventive example was kept in the atmosphere at the temperature of 100° C. to 260° C. for 130 seconds, the state of the conductive paste 103 was observed. As a result, the conductive paste 103 on one electrode pad 22 did not come into contact with the conductive paste 103 on another electrode pad 22 adjacent thereto.

(2) Second Inventive Example

A manufacturing method of a second inventive example is different from the manufacturing method of the first inventive example in the following points.

In the second inventive example, the length c shown in FIG. 5 of the opening 101 was 500 μm. In this case, a sum of areas of the two recess formation regions 55 was a size of about 6% of the area of the rectangle formed by the length a in the longitudinal direction and the length b in the width direction of the opening 101.

After the suspension substrate 1 on which the conductive paste 103 had been applied by the manufacturing method of the second inventive example was kept in the atmosphere at the temperature of 100° C. to 260° C. for 130 seconds, the state of the conductive paste 103 was observed. As a result, the conductive paste 103 on one electrode pad 22 did not come into contact with the conductive paste 103 on another electrode pad 22 adjacent thereto.

(3) Third Inventive Example

A manufacturing method of a third inventive example is different from the manufacturing method of the first inventive example in the following points.

In the third inventive example, the length d shown in FIG. 5 of the opening 101 was 20 μm. In this case, a sum of areas of the two recess formation regions 55 was a size of about 11% of the area of the rectangle formed by the length a in the longitudinal direction and the length b in the width direction of the opening 101.

After the suspension substrate 1 on which the conductive paste 103 had been applied by the manufacturing method of the third inventive example was kept in the atmosphere at the temperature of 100° C. to 260° C. for 130 seconds, the state of the conductive paste 103 was observed. As a result, the conductive paste 103 on one electrode pad 22 did not come into contact with the conductive paste 103 on another electrode pad 22 adjacent thereto.

(4) Comparative Example

A manufacturing method of a comparative example is different from the manufacturing method of the first inventive example in the following points.

In the comparative example, the conductive paste 103 was applied onto the electrode pads 22 by using the screen plate having the openings in which the recesses 54 had not been formed. That is, the rectangular openings each having the length in the longitudinal direction of 900 μm and the length in the width direction of 280 μm had been formed in the screen plate used in the comparative example.

When the suspension substrate 1 on which the conductive paste 103 had been applied by the manufacturing method of the comparative example was kept in the atmosphere at the temperature of 100° C. to 260° C. for 130 seconds, the conductive paste 103 on part of the electrode pads 22 came into contact with the conductive paste 103 on electrode pads 22 adjacent thereto, resulting in generation of a short circuit.

(5) Evaluation

It is found that the conductive paste 103 on one electrode pads 22 can be prevented from coming into contact with the conductive paste 103 on another electrode pad 22 adjacent thereto by applying the conductive paste 103 onto the electrode pads 22 by using the screen plate 100 having the openings 101 in which the recesses 54 were formed, as described above.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A manufacturing method of a printed circuit board comprising the steps of:
    forming a circuit board having a plurality of conductive pads on an insulating layer of said circuit board; and
    placing a printing mask, which has a plurality of openings corresponding to said plurality of conductive pads, on said circuit board and applying conductive paste onto said plurality of conductive pads through said plurality of openings,
    wherein a respective peripheries of each of the openings of said printing mask is bent in a concave shape toward a respective inside of each of the openings to form rectangular recesses, and
    wherein each of said plurality of openings is composed of a first wide portion, a narrow portion and a second wide portion that are formed in a rectangular region, said first and second wide portions are arranged along both end sides if said rectangular region, said narrow portion is arranged between said first wide portion and said second wide portion so as to extend in parallel with both lateral sides of said rectangular region, said recesses correspond to respective regions between the both lateral sides of said rectangular region and both lateral sides of said narrow portion,
    when it is assumed that a length of said lateral side of said rectangular region is a, a length of said end side of said rectangular region is b, and an area of said opening is A, said opening satisfies a relation obtained by $0.05 < (a \times b - A)/(a \times b)$.

2. The manufacturing method of the printed circuit board according to claim 1, wherein said recesses of the adjacent openings in said printing mask are formed in positions in which said recesses are opposite to one another.

3. The manufacturing method of the printed circuit board according to claim 1, wherein said opening satisfies a relation obtained by $(a \times b - A)/(a \times b) < 0.12$.

* * * * *